(12) United States Patent
Kang et al.

(10) Patent No.: US 11,876,110 B2
(45) Date of Patent: Jan. 16, 2024

(54) SIGE PHOTODIODE FOR CROSSTALK REDUCTION

(71) Applicant: OMNIVISION TECHNOLOGIES, INC., Santa Clara, CA (US)

(72) Inventors: Heesoo Kang, Cupertino, CA (US); Bill Phan, San Jose, CA (US); Seong Yeol Mun, Santa Clara, CA (US)

(73) Assignee: OMNIVISION TECHNOLOGIES, INC., Santa Clara, CA (US)

(*) Notice: Subject to any disclaimer, the term of this patent is extended or adjusted under 35 U.S.C. 154(b) by 58 days.

(21) Appl. No.: 17/343,553

(22) Filed: Jun. 9, 2021

(65) Prior Publication Data
US 2022/0399393 A1     Dec. 15, 2022

(51) Int. Cl.
*H01L 27/146* (2006.01)

(52) U.S. Cl.
CPC .... *H01L 27/14647* (2013.01); *H01L 27/1463* (2013.01); *H01L 27/14607* (2013.01); *H01L 27/14621* (2013.01); *H01L 27/14627* (2013.01); *H01L 27/14685* (2013.01); *H01L 27/14689* (2013.01)

(58) Field of Classification Search
None
See application file for complete search history.

(56) References Cited

U.S. PATENT DOCUMENTS

| | | | |
|---|---|---|---|
| 7,449,712 B2 | 11/2008 | Cha | |
| 8,629,486 B2* | 1/2014 | Ahn | H01L 27/1462 250/214 R |
| 9,590,005 B1* | 3/2017 | Qian | H01L 27/1461 |
| 10,256,270 B2 | 4/2019 | Margutti et al. | |
| 10,334,191 B1 | 6/2019 | Yang et al. | |
| 2010/0032736 A1* | 2/2010 | Sudo | H01L 27/14621 257/350 |
| 2015/0200223 A1* | 7/2015 | Lee | H01L 31/1812 257/292 |
| 2021/0225922 A1* | 7/2021 | Na | H01L 31/0376 |

OTHER PUBLICATIONS

Iesaka, M., et al., "Low Noise Silicon Germanium Image Sensor," U.S. Appl. No. 16/863,771, filed Apr. 30, 2020, 42 pages.

* cited by examiner

*Primary Examiner* — Ali Naraghi
(74) *Attorney, Agent, or Firm* — Christensen O'Connor Johnson Kindness PLLC

(57) ABSTRACT

SiGe photodiode for crosstalk reduction. In one embodiment, an image sensor includes a plurality of pixels arranged in rows and columns of a pixel array disposed in a semiconductor material. Each pixel includes a plurality of photodiodes. The plurality of pixels are configured to receive an incoming light through an illuminated surface of the semiconductor material. Each pixel includes a first photodiode comprising a silicon (Si) material; and a second photodiode having the Si material and a silicon germanium (SiGe) material.

15 Claims, 17 Drawing Sheets

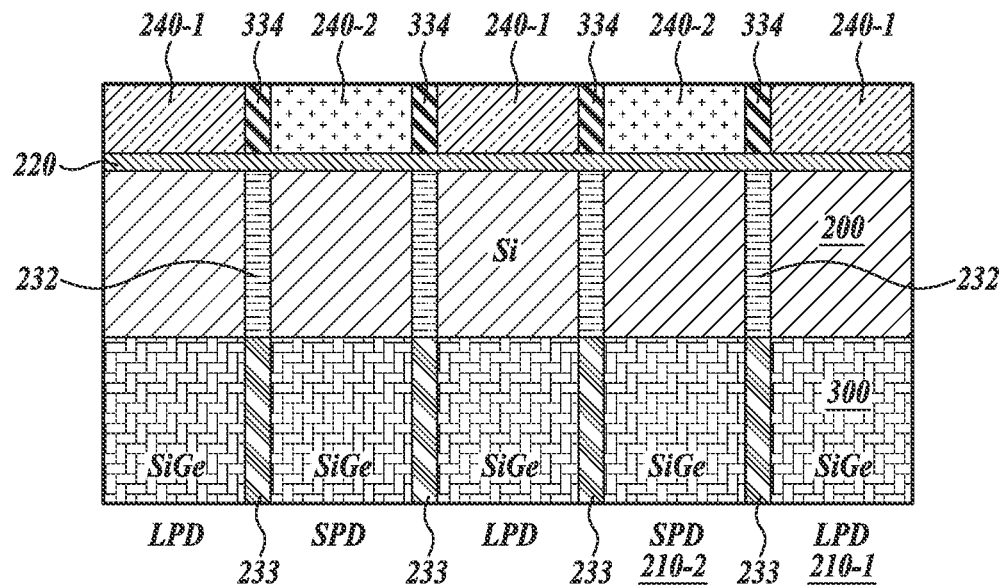
FIG. 10E
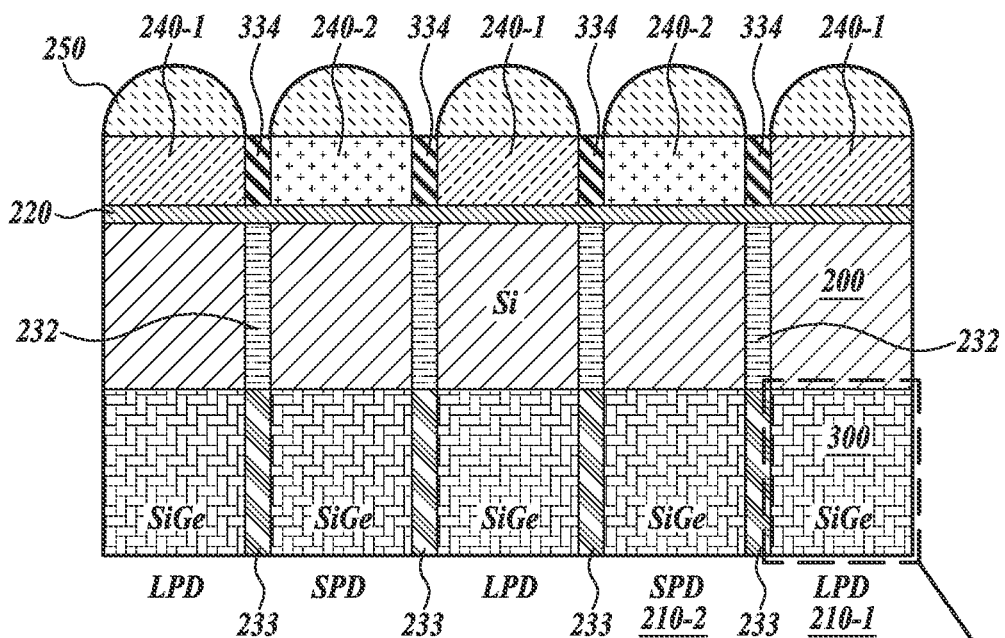
FIG. 10F     DETAIL B

SIGE PHOTODIODE FOR CROSSTALK REDUCTION

BACKGROUND INFORMATION

Field of the Disclosure

This disclosure relates generally to the design of image sensors, and in particular, relates to image sensors that use Silicon Germanium (SiGe) for crosstalk reduction.

Background

Image sensors have become ubiquitous. They are widely used in digital still cameras, cellular phones, security cameras, as well as medical, automotive, and other applications. The technology for manufacturing image sensors continues to advance at a great pace. For example, the demands for higher image sensor resolution and lower power consumption motivate further miniaturization and integration of image sensors into digital devices.

In some applications, photodiodes of the image sensor have different light-absorption capacities to improve capturing of images having a large dynamic range. For example, an image sensor may include large photodiodes (LPDs) having a relatively large light-absorption capacity and small photodiodes (SPDs) having smaller capacity operating in tandem to capture the incoming light. In practical applications, the LPDs may be physically larger than the SPDs, or the LPDs and SPDs may have same size, while the SPDs include additional light attenuation elements. However, in many situations the photodiodes may be subjected to a crosstalk where the light received by one photodiode propagates toward an adjacent photodiode. Such crosstalk affects the accuracy of the photodiode light intensity reading, especially so for the SPDs in view of their smaller light-absorption capacity. Therefore, systems and methods are needed for improved handling of crosstalk among pixels.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIGS. 10A-10F illustrate steps of a manufacturing process for a sample image sensor in accordance with an embodiment of the present technology.

Figure 1:
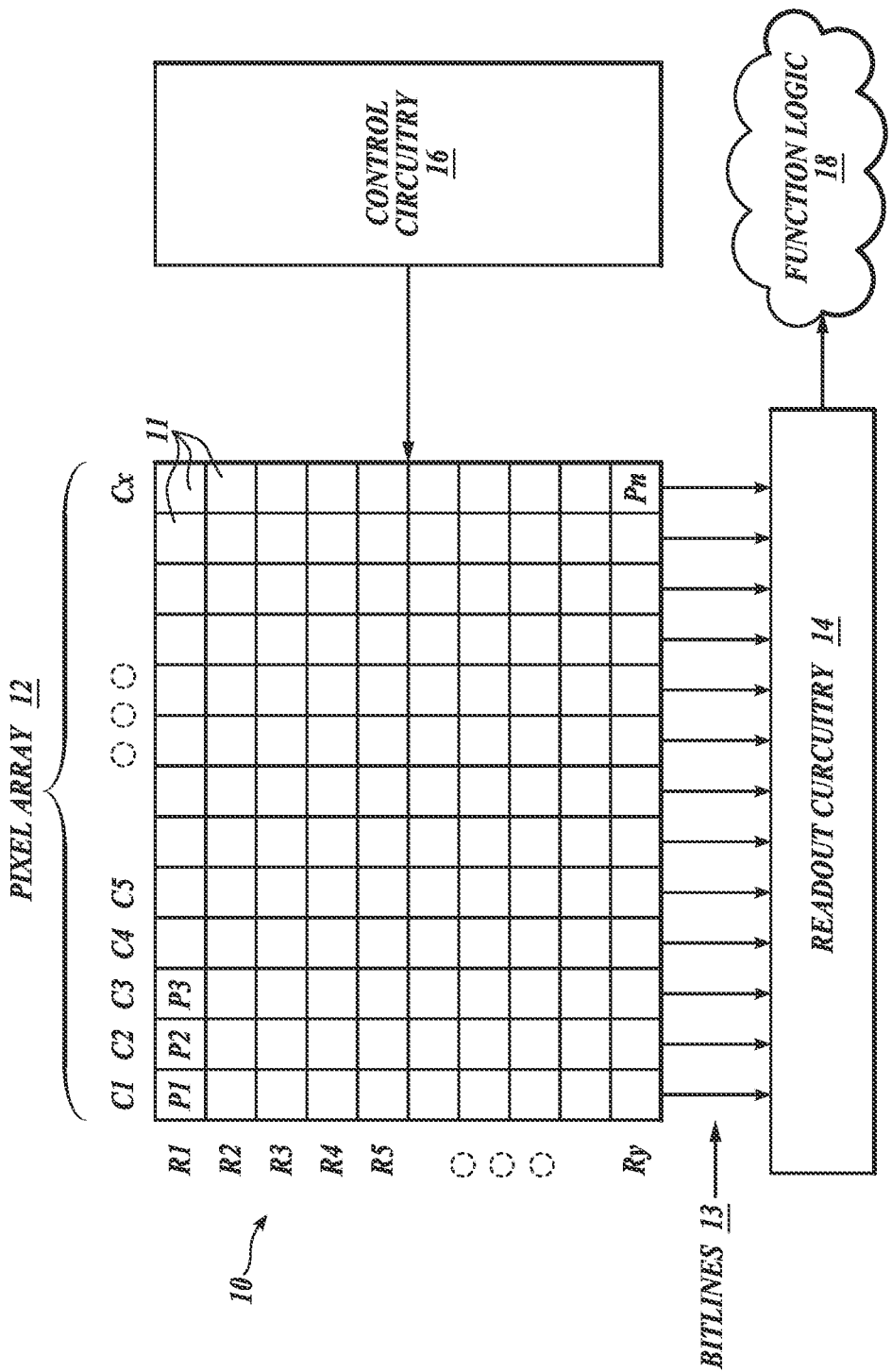
FIG. 1 is a diagram of an example image sensor in accordance with an embodiment of the present technology.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Image sensors, and in particular, image sensors include Silicon Germanium (SiGe) layer are disclosed. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

From the foregoing, it will be appreciated that specific embodiments of the technology have been described herein for purposes of illustration, but that various modifications may be made without deviating from the disclosure. Moreover, while various advantages and features associated with certain embodiments have been described above in the context of those embodiments, other embodiments may also exhibit such advantages and/or features, and not all embodiments need necessarily exhibit such advantages and/or features to fall within the scope of the technology. Where methods are described, the methods may include more, fewer, or other steps. Additionally, steps may be performed in any suitable order. Accordingly, the disclosure can encompass other embodiments not expressly shown or described herein. In the context of this disclosure, the term "about" means+/−5% of the stated value.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Briefly, the embodiments of the present technology are directed to photodiodes that are manufactured using silicon (Si) material and silicon-germanium (SiGe) material. Generally, the SiGe material has a higher absorption coefficient than does a comparable Si layer. As a result, the photodiodes that include a photodiode region formed of SiGe material transmit less stray light toward their neighbor photodiodes, therefore reducing the crosstalk. Furthermore, the index of refraction is larger for SiGe material than for Si material. As a result, for at least some angles of incidence the light leaving the SiGe material region of a photodiode reflects back into associated photodiode region of the respect photodiode, thus further reducing the crosstalk between the adjacent photodiodes. In different embodiments, the image sensors may be front side illuminated or backside illuminated image sensors.

In general, small photodiodes (SPDs) are more sensitive to crosstalk than large photodiodes (LPDs), because of the smaller light-absorption capacity of the SPDs. Therefore, in some embodiments, LPDs include photodiode regions formed of SiGe material to reduce the amount of stray light reaching the adjacent SPDs. In other embodiments, both LPDs and SPDs may include photodiode regions formed of SiGe material.

In some situations, a lattice mismatch between the Si material layer and the SiGe material layer of a photodiode may generate dark current inside the photodiode affecting sensitivity of the photodiode. Therefore, in some embodiments of the inventive technology, the concentration of Ge in the SiGe material layer is changed gradually as $Si_{1-x}Ge_x$, where x varies along the thickness of the SiGe material layer (i.e., along the vertical depth of the SiGe layer in a semiconductor substrate from the front side of semiconductor substrate), thus providing a more gradual change of the concentration of Ge, which reduces lattice mismatch and the resulting dark current. In some embodiments, x can range between 0 and 1.

FIG. 1 is a diagram of an example image sensor 10 in accordance with an embodiment of the present technology. The image sensor 10 includes a pixel array 12, a control circuitry 16, a readout circuitry 14 and a function logic 18. In one example, the pixel array 12 is a two-dimensional (2D) array of image sensor pixels 11 (e.g., pixels P1, P2 . . . , Pn).

Each of image sensor pixel 11 includes a large photodiode (LPD) for low light detection and a small photodiode (SPD) for bright light detection. In different embodiments, two or more image sensor pixels 11 may be grouped into a plurality of pixel cells. As illustrated, the image sensor pixels 11 are arranged into rows (e.g., rows R1 to Ry) and columns (e.g., columns C1 to Cx). In operation, the image sensor pixels 11s acquire image data of a scene, which can then be used to render a 2D image of person, place, object, etc. However, in other embodiments the image sensor pixels 11 may be arranged into configurations other than rows and columns.

In an embodiment, after each image sensor pixel 11 in the pixel array 12 acquires its image charge, the image data is read out by the readout circuitry 14 via bitlines 13, and then transferred to a function logic 18. The readout image data of each image sensor pixel 11 collectively constitute an image frame. In various embodiments, the readout circuitry 14 may include signal amplifiers, analog-to-digital (ADC) conversion circuitry and data transmission circuitry. The function logic 18 may store the image data or even manipulate the image data by applying post image effects (e.g., crop, rotate, remove red eye, adjust brightness, adjust contrast, or otherwise). In some embodiments, the control circuitry 16 and function logic 18 may be combined into a single functional block to control the capture of images by the image sensor pixels 11 and the readout of image data from the readout circuitry 14. The function logic 18 may include a digital processor. In an embodiment, the readout circuitry 14 may read one row of image data at a time along readout column lines (bitlines 13) or may read the image data using a variety of other techniques, such as a serial readout or a full parallel readout of all pixels simultaneously.

In one embodiment, the control circuitry 16 is coupled to the pixel array 12 to control operation of the plurality of photodiodes in the pixel array 12. For example, the control circuitry 16 may generate a shutter signal for controlling image acquisition. In one embodiment, the shutter signal is a global shutter signal for simultaneously enabling all pixels within the pixel array 12 to simultaneously capture their respective image data during a single data acquisition window. In another embodiment, the shutter signal is a rolling shutter signal such that each row, column or group of pixels is sequentially enabled during consecutive acquisition windows. In another embodiment, image acquisition is synchronized with lighting effects such as a flash. In different embodiments, the control circuitry 16 may be configured to control each of image sensor pixels 11 to perform the acquiring operations of one or more dark current pixel frames for image calibration and normal image frames.

In one embodiment, readout circuitry 14 includes analog-to-digital converters (ADCs), which convert analog image data received from the pixel array 12 into a digital representation. The digital representation of the image data may be provided to the function logic 18.

In different embodiments, image sensor 10 may be part of a digital camera, cell phone, laptop computer, or the like. In embodiments, image sensor 10 is incorporated as part of surveillance system or vision system for automobile. Additionally, image sensor 10 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to the image sensor 10, extract image data from the image sensor 10, or manipulate image data supplied by image sensor 10.

Figure 2:
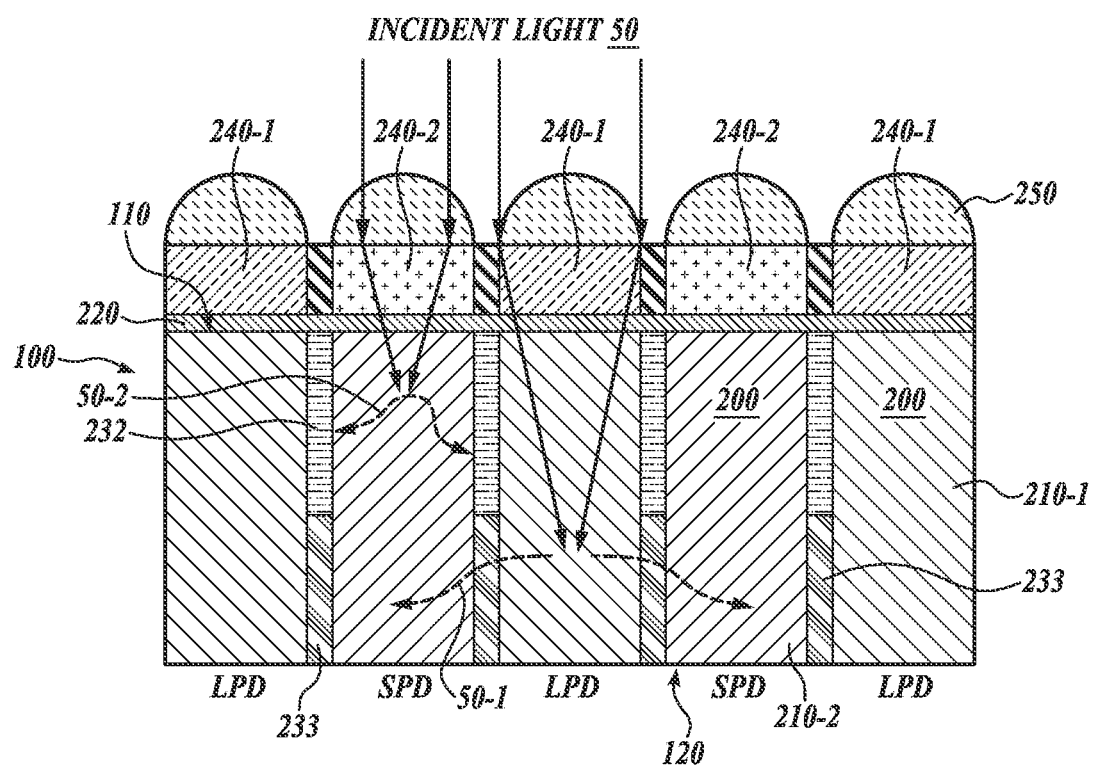
FIGS. 2 and 3 are cross-sectional side views illustrating crosstalk between photodiodes in accordance with embodiments of the present technology.
Figure 3:
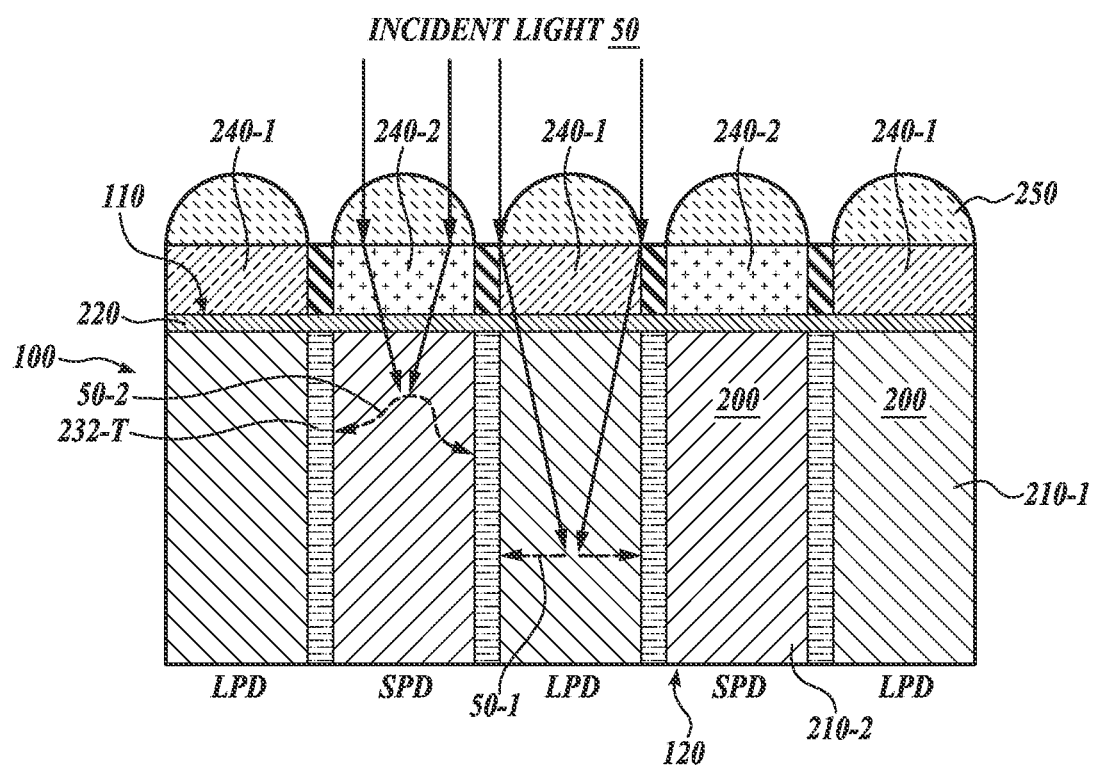

FIGS. 2 and 3 are cross-sectional side views illustrating crosstalk between photodiodes in accordance with embodiments of the present technology. In operation, incident light 50 enters the image sensor 100 through microlenses 250 and color filters 240, which focus and appropriately color-filter the incident light for a given photodiode 210. For example, a green photodiode may include a green color filter that transmits green light, while reflecting other wavelengths of light. Furthermore, the color filters 240 may differently attenuate the incoming light for the small photodiodes (SPDs) 210-2 and large photodiodes (LPDs) 210-1 formed in a semiconductor substrate or a semiconductor material. As explained above, in general the SPDs 210-2 are configured to have lower sensitivity to and/or smaller absorption capacity of the incoming light compared to LPDs 210-1. Some examples of differences between the SPDs and LPDs are illustrated with respect to FIGS. 5 and 7 below. In some embodiments, a dielectric layer 220 (also referred to as a planarization layer or buffer oxide layer) separates the color filters 240 from the photodiodes 210. In some embodiments, the dielectric layer 220 may be 1000-1600 Å thick. In some embodiments dielectric layer 220 is formed of oxide material.

In some embodiments, each of the photodiodes 210 includes doped regions (e.g., a P-doped region and an N-doped region) forming the photodiode regions for the respective photodiode 210 in a semiconductor substrate or semiconductor material of opposite conductive type (e.g., P-type doped semiconductor substrate). In the illustrated example, a semiconductor substrate may be formed of silicon material, thus it may also be referred to as a Si material 200, a silicon substrate 200, or a layer 200. Therefore, terms semiconductor substrate 200 and Si material 200 may be used interchangeably. Photodiodes 210 operate to photogenerate electrical charge based on the incoming light 50. These electrical charges are subsequently selectively drained into the associated supporting electronics of the photodiode 210, for example, a floating diffusion associated with the photodiode 210 through a respective coupled transfer transistor.

FIG. 2 illustrates the LPDs 210-1 and SPDs 210-2 that are subjected to crosstalk. For example, the incoming light 50, for example light of longer wavelength such as red or infrared light may enter an SPD 210-2, where the light is partially absorbed and partially transmitted in the direction of the neighboring LPDs 210-1. Analogously, the incoming light 50 (e.g., red or infrared light) may enter an LPD 210-1, become partially absorbed, but also be partially transmitted toward the neighboring SPDs 210-2, for example by refraction or reflection induced crosstalk. In some embodiments, the neighboring photodiodes are separated by isolation structures that limit propagation of stray light from one photodiode 210 (e.g., a LPD 210-1) to another (e.g., SPD 210-2 adjacent to the LPD 210-1). Some examples of such isolation structures are deep trench isolation (DTI) structures 232 that vertically extend up to a first depth (e.g., 1.5 um to 2.5 um) into the Silicon (Si) material 200 from a backside 110 of the Si material 200, and isolation wells 233 that extend into a second depth (thickness) of the Si material 200 from a front side 120 of the Si material 200. In one example, DTI structures 232 are interconnected thus forming a grid structure surrounding LPDs 210-1, SPDs 210-2 and providing isolation between adjacent LPDs 210-1, between adjacent SPDs 210-2, and between adjacent LPDs 210-1 and SPDs 210-2. In one example, the thickness of Si material 200 may range from 2.5 um to 6 um. The second depth of each isolation wells 233 extends into Si material 200 may range from 2 um up to the thickness of Si material 200. The DTI structure 232 provides electrical and/or optical isolation between adjacent photodiodes 210. In different embodiments, the DTI structure 232 may include materials that are non-transparent to light, for example metals. In some embodiments, the DTI structure 232 may include dielectric material with refractive index lower than the Si material 200, such as silicon oxide. The isolation wells 233 may be formed of an implant isolation having opposite conductive type to photodiodes 210, such a P-type isolation well that remains transparent to light. In one example, the isolation wells 233 are each implanted by ion implantation onto the front side 120 of Si material 200. In one example, the isolation wells 233 are of same conductive type as the Si material 200, and the impurity concentration of the isolation wells 233 may be higher than the impurity concentration of the Si material 200. The DTI structure 232 may prevent or at least reduce the stray light 50-2 from reaching the neighbor photodiodes. However, the isolation wells 233 comprising doped silicon material enable most or all of the stray light 50-1 to pass therethrough, for example in the region between the bottom of DTI 232 and the front side 120 of the Si material 200 for example, from, an LPD 210-1 to an SPD 210-2, thus causing crosstalk between the photodiodes. In one example, the front side 120 of the Si material 200 may be a non-illuminated side of image sensor 100, and the backside 110 of the Si material 200 may be an illuminated side of image sensor 100. In another example, the front side 120 may be an illuminated side of image sensor 100, and the backside 110 may be a non-illuminated side of image sensor 100.

FIG. 3 illustrates the LPDs 210-1 and SPDs 210-2 that are separated by the DTI structures 232-T essentially throughout the entire thickness of the Si material layer 200. Such depth of the DTI structures 232-T would generally be effectively in preventing or reducing crosstalk among pixels. However, the illustrated DTI structures 232-T may be difficult to manufacture due to process margin issues. For example, DTI structures 232-T are typically formed from the back side 110, and over-etch may damage circuitry (e.g., pixel circuit components such as transistors) located on the front side 120 of the image sensor 100. With the illustrated image sensor, incident light 50 enters through the backside 110 of the Si material 200. However, in different embodiments, light 50 may enter through the front side 120 of the Si material 200.

Figure 4:
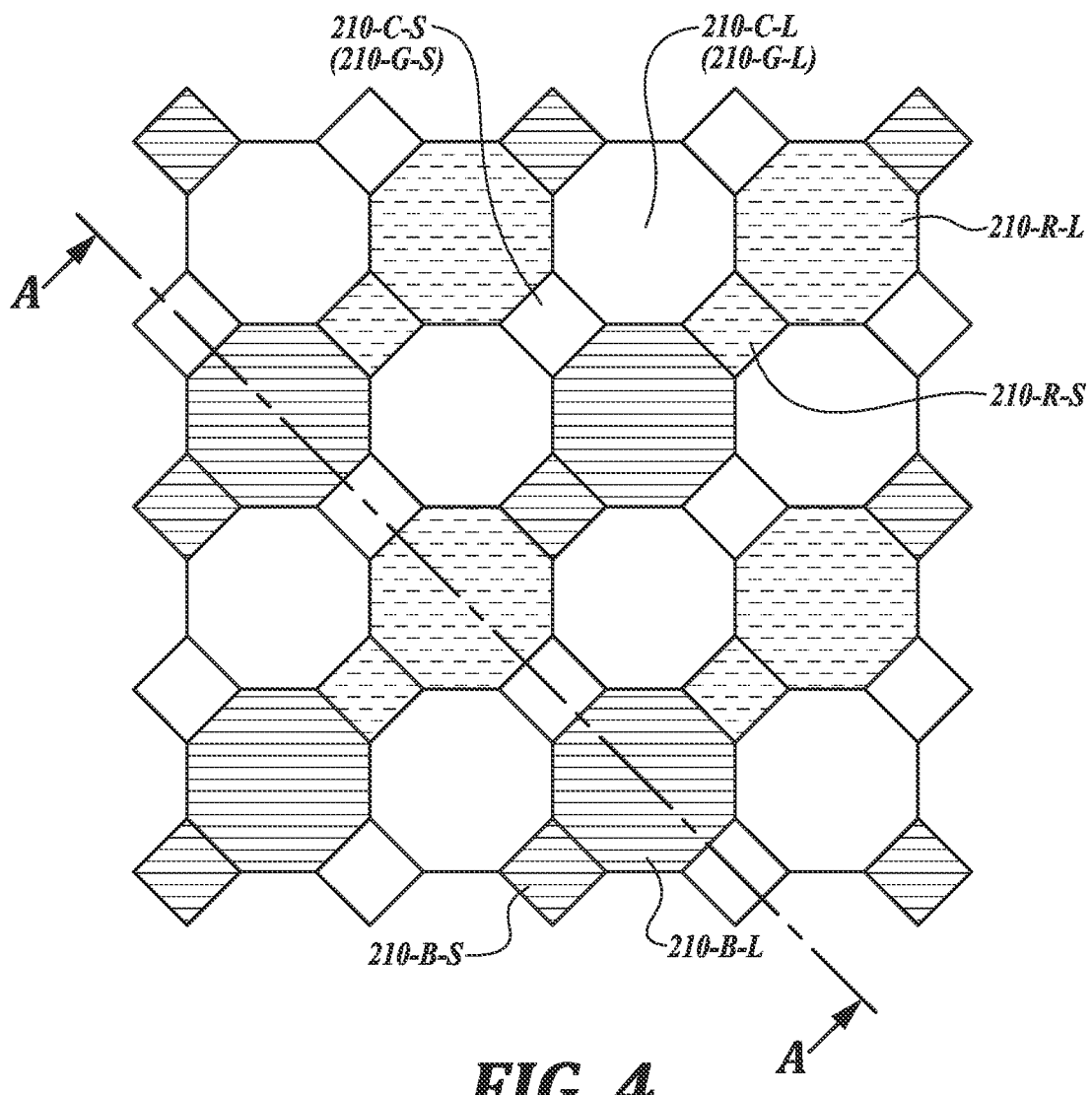
FIG. 4 is a top view of an arrangement of large photodiodes (LPDs) and small photodiodes (SPDs) in accordance with an embodiment of the present technology.

FIG. 4 is a top view of an arrangement of large photodiodes (LPDs) and small photodiodes (SPDs) in accordance with an embodiment of the present technology. Different hatching signifies different color pixels. In some embodiments, a red color pixel may include a large photodiode 210-R-L and a small photodiode 210-R-S. Similarly, a blue color pixel may include a large photodiode 210-B-L and a small photodiode 210-B-S. In some embodiments, the image sensor may use either clear photodiodes 210-C-L, 210-C-S or green photodiodes 210-G-L, 210-G-S. For example, the image sensor may employ color filter patterns of red, blue and green in color filter array for LPDs and SPDs that are arranged according to Bayer pattern. As another example, the image sensor may employ color filter patterns of red, blue and clear in the color filter array for LPDs and SPDs arranged according to Bayer pattern. In the illustrated embodiment, the photodiodes having larger size also have larger light-absorption capacity (i.e., smaller sensitivity to incoming light) and vice versa. In other embodiments, different absorption-capacity of the LPDs and SPDs may be achieved by a differential full well capacity, by placement of light attenuation elements over the SPDs, or by other methods.

Figure 5:
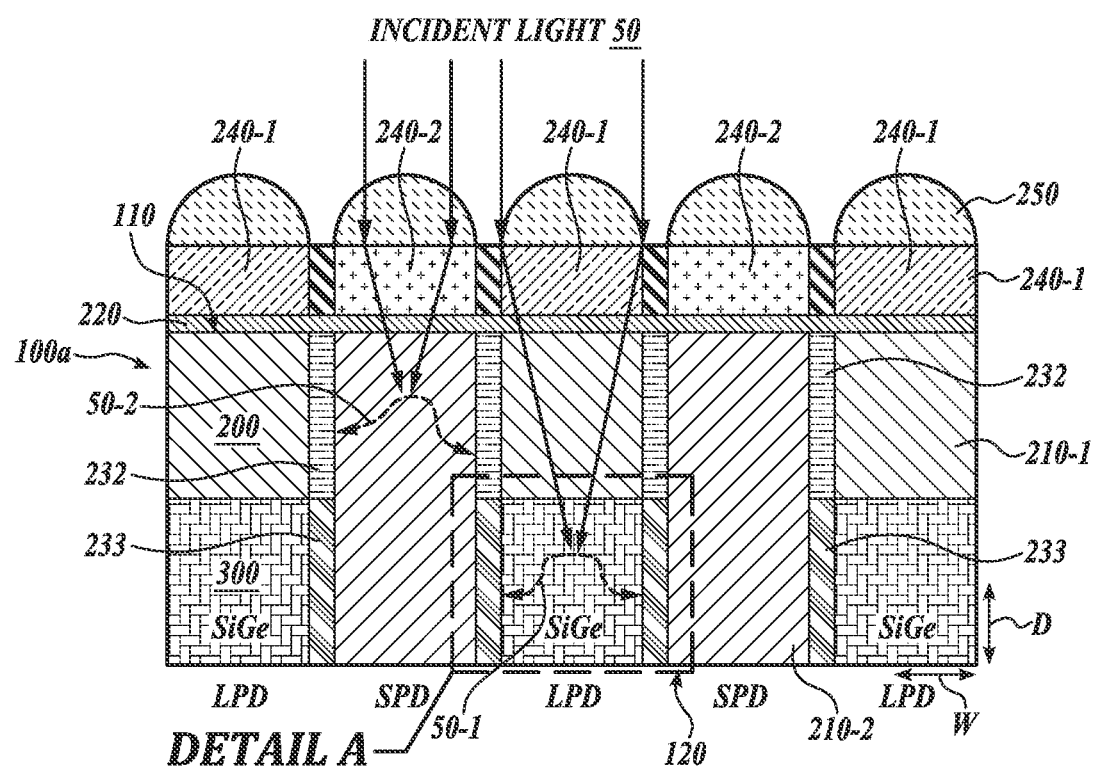
FIG. 5 is a cross-sectional side view of an image sensor having SiGe elements in accordance with an embodiment of the present technology.

FIG. 5 is a cross-sectional side view A-A of an image sensor 100a having SiGe elements in accordance with an embodiment of the present technology. For simplicity, the cross-sectional size of the photodiodes SPD and the photodiodes LPD are shown as being same for all the illustrated photodiodes, even though the photodiodes may have different sizes. The illustrated embodiment is similar to the one shown in FIG. 2 above. However, the composition of LPDs is different. In illustrated embodiment, the photodiode region of each LPD 210-1 includes a SiGe element 300 (also referred to as a region, a layer or a material; hereinafter SiGe layer, SiGe element, and SiGe material may be used interchangeably) that improves absorption of the incoming light 50 inside the target LPD region. The photodiode region of each SPD 210-2 includes Si material layer, to reduce crosstalk between LPDs and SPDs, even when the DTI structures only partially extend through the thickness of the photodiode. Therefore, the SPDs 210-2 (also referred to as first photodiodes) that include Si material layer are interleaved with the LPDs 210-1 (also referred to as the second photodiodes) that include SiGe material. In some embodiments, SiGe element 300 is vertically spaced from the backside 110 (or illuminated side) of Si material 200. In some embodiments, a semiconductor material region (or substrate material region) of Si material 200 is formed in between the SiGe element 300 and the backside 110 (or illuminated side) of Si material 200. In some embodiments, SiGe element 300 associated with photodiode region of LPDs 210-1 may be a material region formed in Si material 200 and the Si material layer associated with photodiode region of SPDs 210-2 may be a region in Si material 200 doped with impurities of conductive type (e.g., N-type) opposite to the conductive type (e.g., P-type) of Si material 200. Some crosstalk-reducing effects of the SiGe element 300 are described with reference to Detail A shown in FIG. 5A below.

Figure 5A:
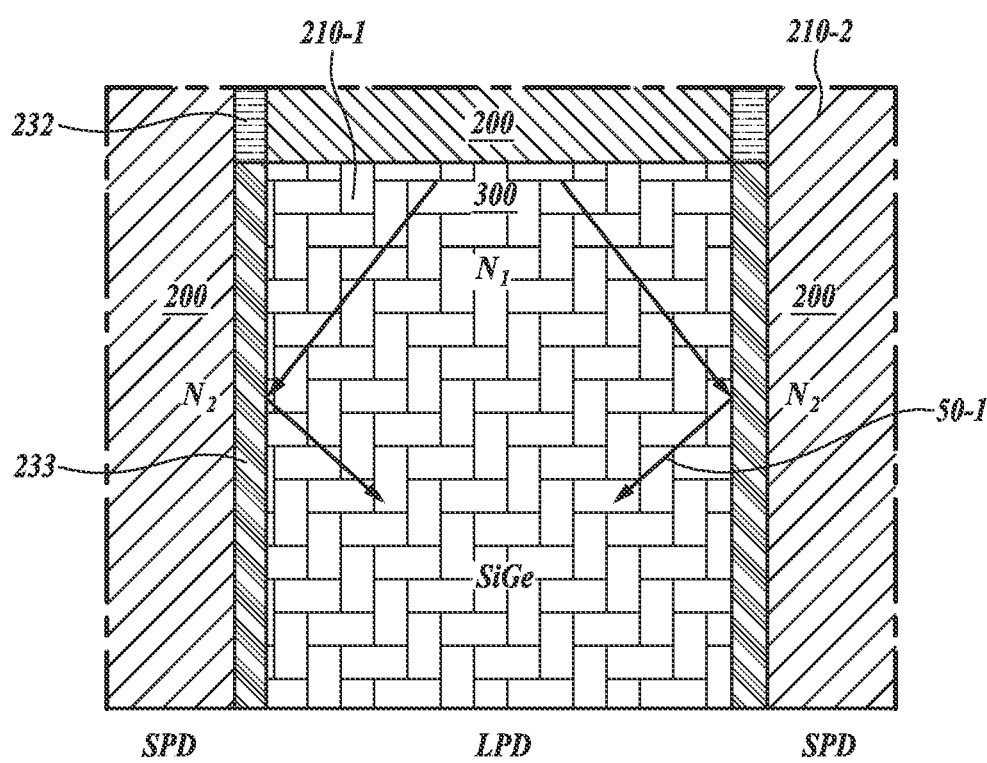
FIG. 5A is a schematic representation of light reflection in SiGe element in accordance with an embodiment of the present technology.

FIG. 5A is a schematic representation of internal reflection of incoming light within SiGe material of LPD in accordance with an embodiment of the present technology. Illustrated LPD 210-1 is surrounded by SPDs 210-2. In operation, the incoming light 50 directed to LPD 210-1 by respective microlens 250 enters the LPD 210-1 through respective color filter 240-1, dielectric layer 220 and the backside 110 of Si material 200 and proceeds toward the SiGe element 300 of LPDs 210-1. The SiGe element 300 limits or prevents crosstalk from the LPD 210-1 to the adjacent SPDs 210-2 by absorption and internal reflection based on at least two material properties of the SiGe element 300. First, since the SiGe material has higher absorption coefficient, more of the incoming light 50-1 can be absorbed inside the LPD 210-1 before entering the adjacent SPDs as a crosstalk. Second, since the SiGe material 300 has higher index of refraction N1 (e.g., about 5.4) than the corresponding index of refraction N2 (e.g., about 3.42) of the Si material 200 inducing total internal reflection effect, most or all of incoming light 50-1 reflects back to the LPD 210-1 instead of crossing over to the adjacent SPDs 210-2 as crosstalk. In other words, having the SiGe material arranged in between Si material regions in horizontal or lateral direction as illustrated in FIG. 5A, an incoming light 50-1 directed to LPD 210-1 can be confined within the photodiode region of LPD 210-1 enhancing light absorption of LPD 210-1, and mitigating crosstalk issue between LPD 210-1 and adjacent SPD 210-2. Collectively, these effects reduce crosstalk from the photodiode that includes the SiGe element 300 toward the adjacent photodiodes.

Figure 6A:
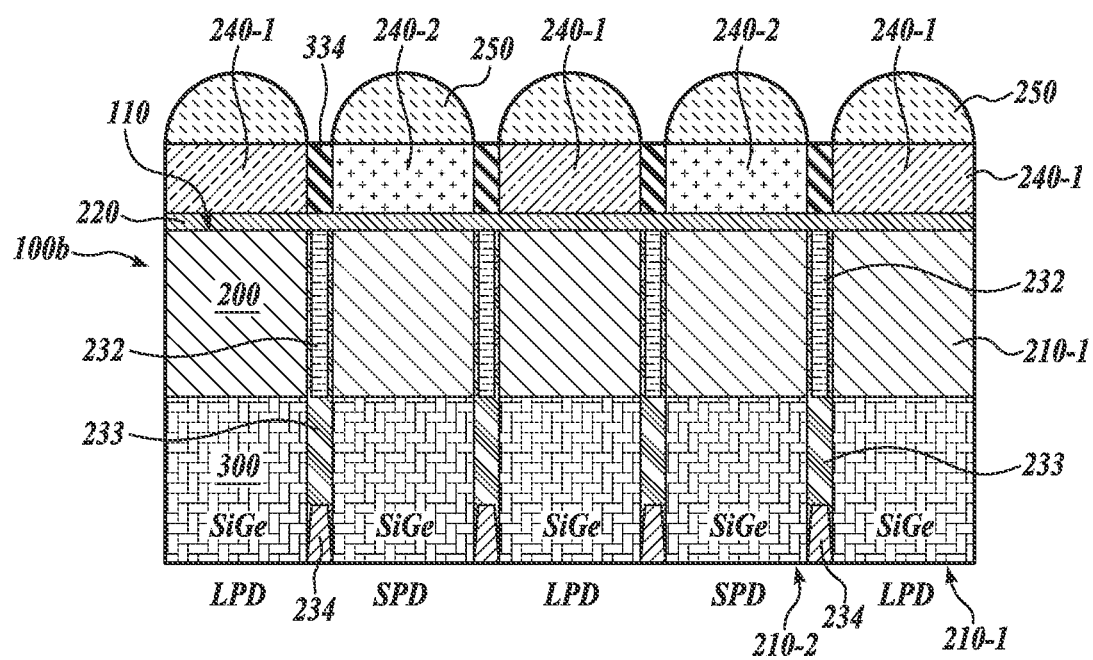
FIGS. 6A and 6B are cross-sectional side views of an image sensor having SiGe elements in accordance with embodiments of the present technology.

FIG. 6A is a cross-sectional side view of an image sensor 100b having SiGe elements in accordance with embodiments of the present technology. Illustrated image sensor 100b includes SiGe layer 300 that forms photodiode regions of both LPDs 210-1 and SPDs 210-2. In some embodiments, presence of the SiGe layer 300 in both photodiode regions of LPD 210-1 and SPD 210-2 may further reduce crosstalk among the photodiodes and increase overall light absorption. In the illustrated embodiment, the image sensor includes a plurality of DTI structures 232, a plurality of isolation wells 233 and a plurality of shallow trench isolation (STI) 234 providing isolation between adjacent LPDs 210-1 and SPD 210-2. The plurality of DTI structures 232 vertically extend a first depth from the backside 110 of Si material 200 into Si material 200 separating the Si material region of adjacent LPDs 210-1 and SPDs 210-2. The plurality of DTI structures 232 may form an isolation grid surrounding individual LPDS 210-1 and SPDs 210-2. The first depth that each of the DTI structures 232 extends into Si material 200 may range from 1.5 um to 2.5 um. Each of isolation wells 233 vertically extends a second depth from the front side 120 of Si material 200 into Si material 200, wherein the second depth may range from 2 um up to the thickness of Si material 200 or substrate thickness. The shallow trench isolation (STI) 234 vertically extends a third depth from the front side 120 of Si material 200 into Si material 200. The third depth of STI 234 is shallower than the second depth of respective isolation well 233 with respect to the front side 120, and may range from 150 nm to 400 nm. The isolation wells 233 and shallow trench isolation (STI) 234 jointly separate and electrically isolate the SiGe region of adjacent LPDs 210-1 and SPDs 210-2, wherein the STI 234 is disposed in the isolation wells 233 with sidewalls passivated by the isolation well 233. In an embodiment, DTI 232 extends into isolation well 233 and surrounded by the isolation well 233. In one embodiment, each of the DTI 232 is vertically aligned with the respective STI 234. In the illustrated embodiment, isolation wells 233 are doped regions in Si material 200 and STI 234 are oxide-filled trench isolation structures. Hence, even though the isolation well 233 may be transparent to transmit stray or unwanted light among the photodiodes, but the presence of the SiGe layer 300 in both the LPD 210-1 and SPD 210-2 with material region having refractive index lower than that of SiGe layer 300, such as silicon material region and/or oxide material region, sandwiched in between SiGe layer 300 of adjacent LPD 210-1 and SPD 210-2 would induce internal reflection effect confining the incoming light directed to LPD 210-1 and SPD 210-2 within their respective photodiode regions, thereby reducing the crosstalk between adjacent LPD 210-1 and SPD 210-2.

Figure 6B:
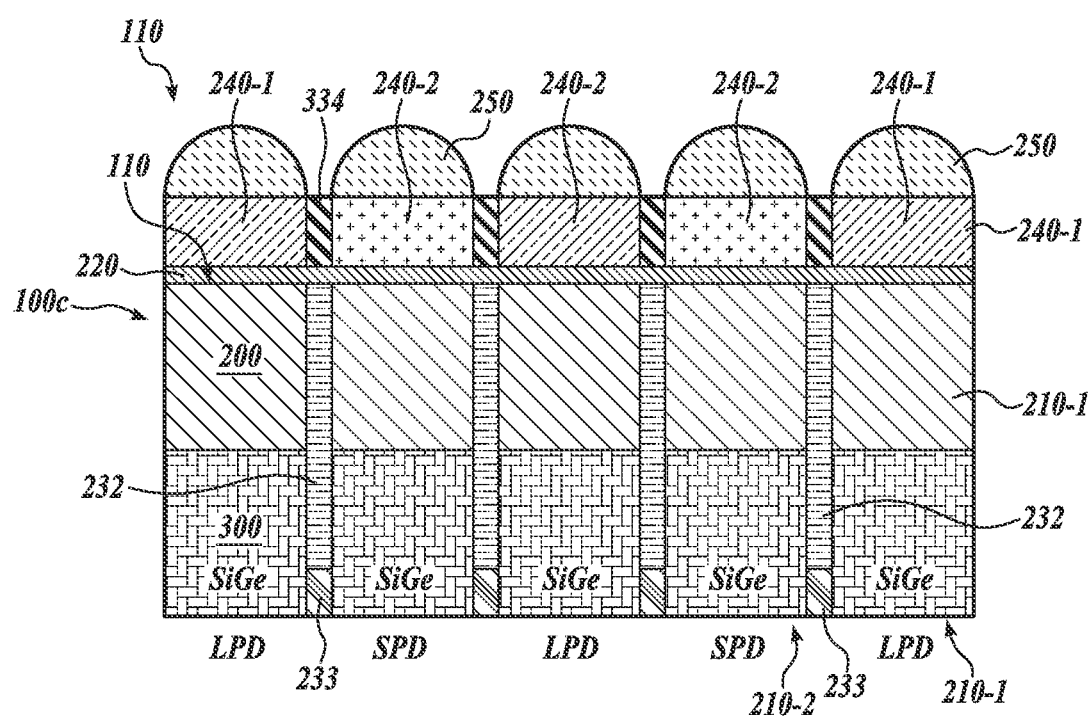

In one example, each of the plurality of DTI structures 232 extends from the backside 110 of Si material 200 into Si material 200 separating the Si material region and at least part of the SiGe layer region of adjacent LPDs 210-1 and SPDs 210-2. FIG. 6B is a cross-sectional side view of an image sensor 100c having SiGe elements in accordance with embodiments of the present technology. In the illustrated embodiment the plurality of DTI structures 232 extends vertically to a depth greater than the first depth into the Si material 200 from the backside 110, and passes the boundary between the Si material region of Si material 200 and the SiGe material. DTI structures 232 in illustrated example may be oxide-material filled trench structure, where an index of refraction of oxide material (e.g., about 1.45) is also lower than index of refraction of SiGe material, hence would also confine the incoming light directed to LPD 210-1 within photodiode region of LPD 210-1. DTI structures 232 therefore provide electrical and/or optical isolation in a greater depth within Si material 200, thus further reducing the crosstalk between adjacent photodiodes, e.g., between adjacent LPD 210-1 and SPD 210-2.

Figure 7:
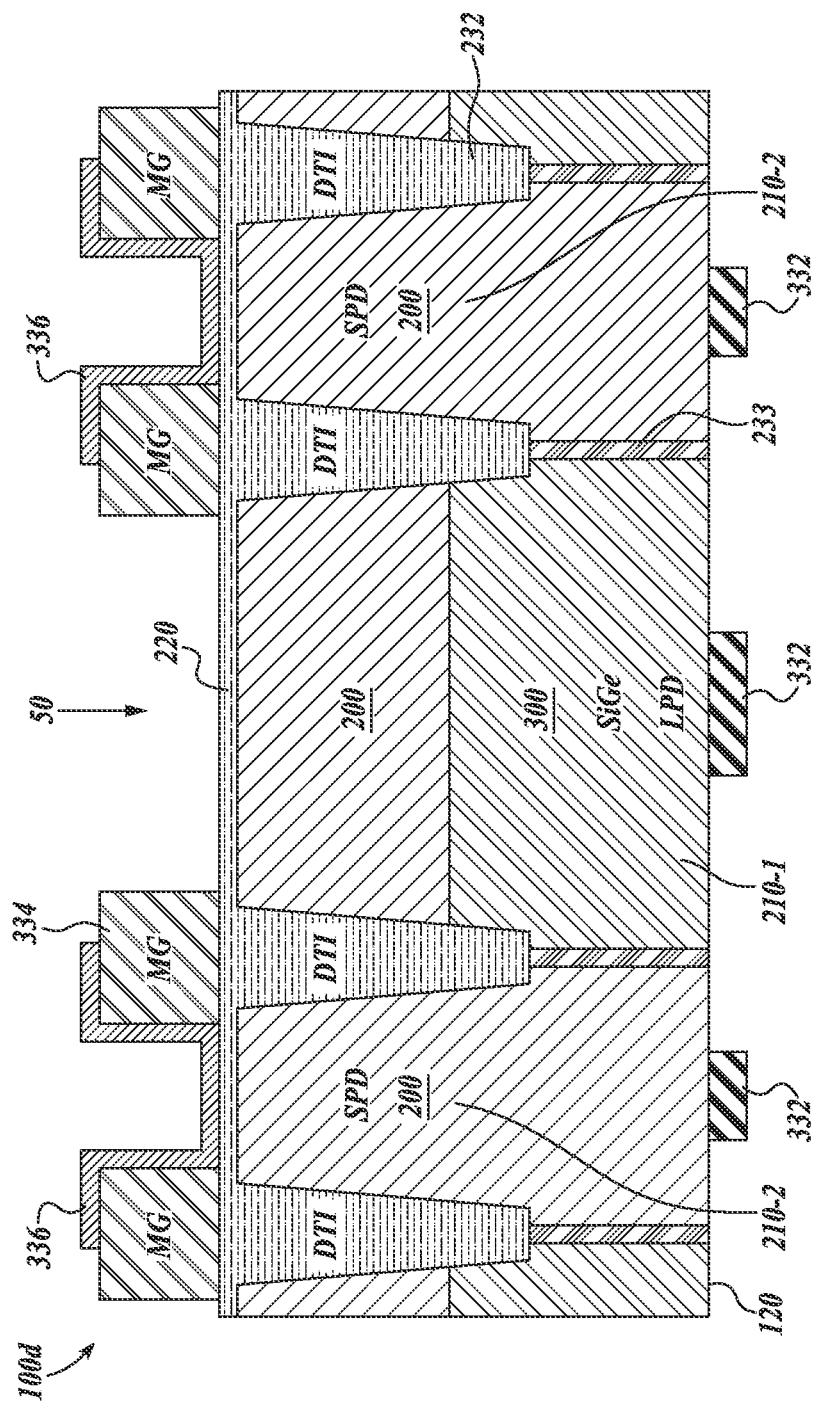
FIG. 7 is a cross-sectional side view of an image sensor having SiGe elements in accordance with an embodiment of the present technology.

FIG. 7 is a cross-sectional side view of an image sensor 100d having SiGe elements in accordance with an embodiment of the present technology. In some embodiments, the image sensor 100d includes metal grid 334 at the backside 110 and gates (e.g., transistor gates) 332 at the front side 120 of Si material 200 coupled to respective LPDs 210-1 and SPDs 210-2 formed in Si material 200. Metal grid 334 includes a plurality of interconnected metal segments defining a plurality of apertures optically aligned with the light exposure or photo-sensing sensing region of LPDs 210-1 and SPDs 210-2. In some embodiments, metal segments of metal grid 334 separates color filters 240 (e.g., color filters 240-1, 240-2 of FIG. 5) of the color filter array deposited in the plurality of apertures. In some embodiments, metal grid 334 surrounds color filters. In some embodiments, metal grid 334 is embedded in the color filter array. Incoming light directed through respective microlenses (e.g., microlenses 250 of FIG. 5) pass through respective metal grid 334 defined apertures toward respective LPDs 210-1 and SPDs 210-2. Metal grid 334 may provide optical isolation between adjacent LPDs 210-1 and SPDs 210-2 before light enters Si material 200.

The illustrated image sensor 100d includes photodiodes of different size—the LPD 210-1 having a larger cross-sectional area or larger light exposure area than the SPD 210-2, resulting in the LPD 210-1 with larger light-absorption capacity than the SPD 210-2. Furthermore, the stack for the SPD 210-2 includes a light attenuation layer 336 on the metal grid 334 covering the apertures optically aligned to the light exposure or photo-sensing sensing region of SPDs 210-2 that further reduces the amount of light reaching SPD 210-2. In some embodiments, the light attenuation layer 336 may include titanium (Ti) and/or titanium nitride (TiN). The LPD 210-1 includes SiGe material 300 that reduces crosstalk from the LPD toward the adjacent SPDs 210-1 within Si material 200.

Figure 9A:
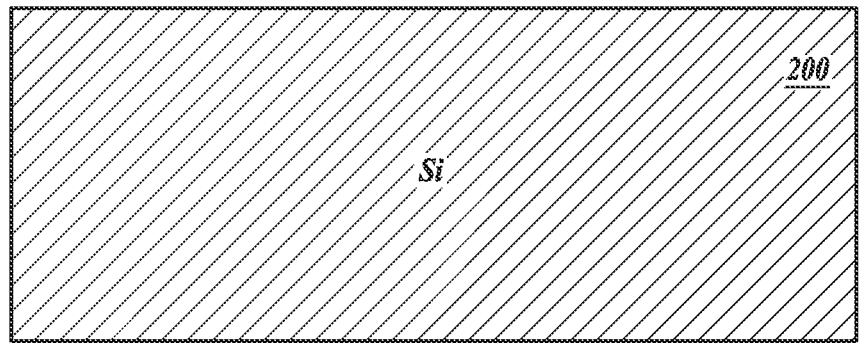
FIGS. 9A-9F illustrate steps of a manufacturing process for a sample image sensor in accordance with an embodiment of the present technology.
Figure 9B:
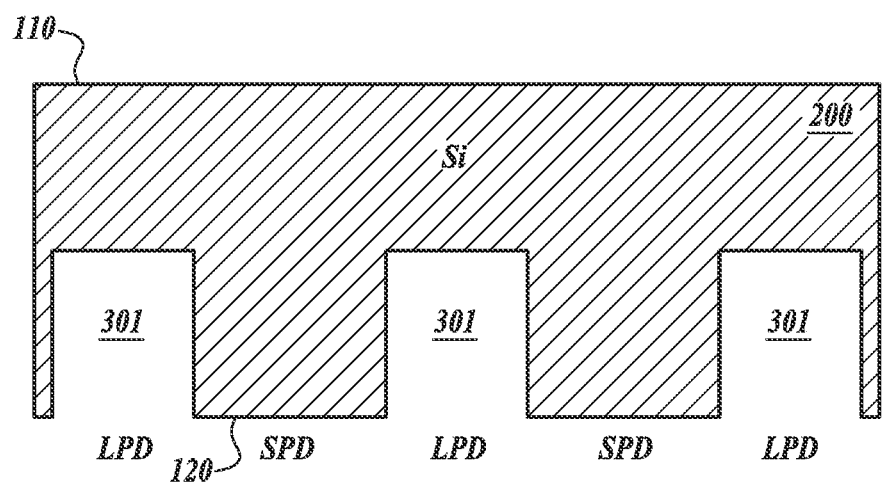
Figure 9C:
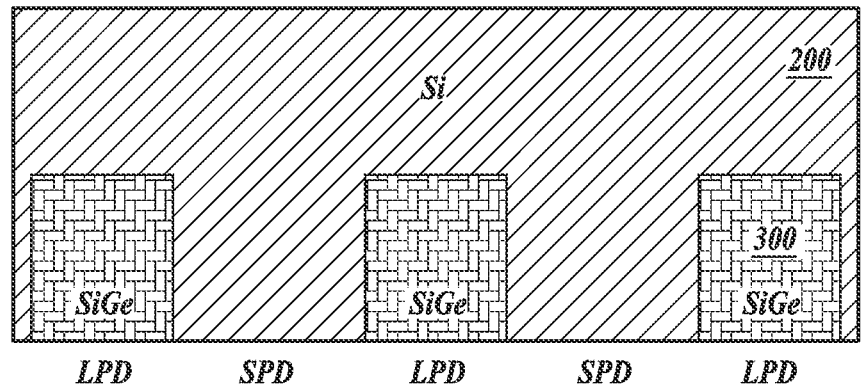
Figure 9D:
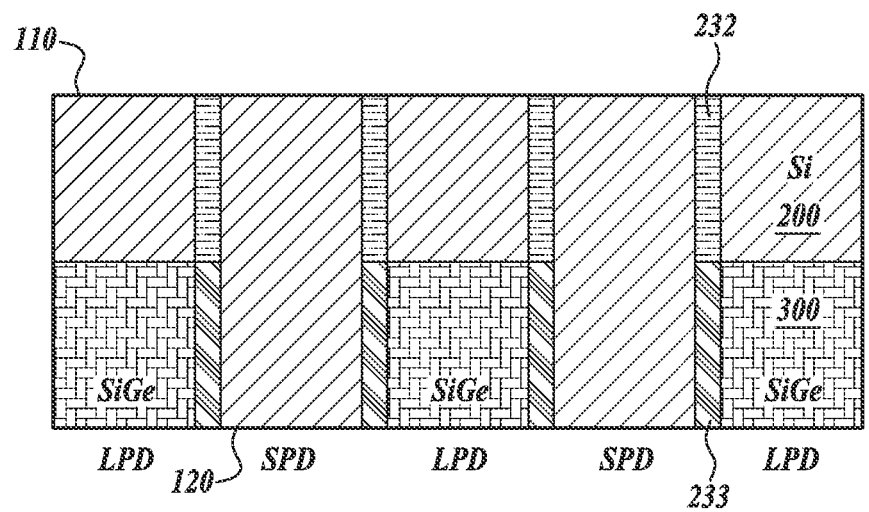
Figure 9E:
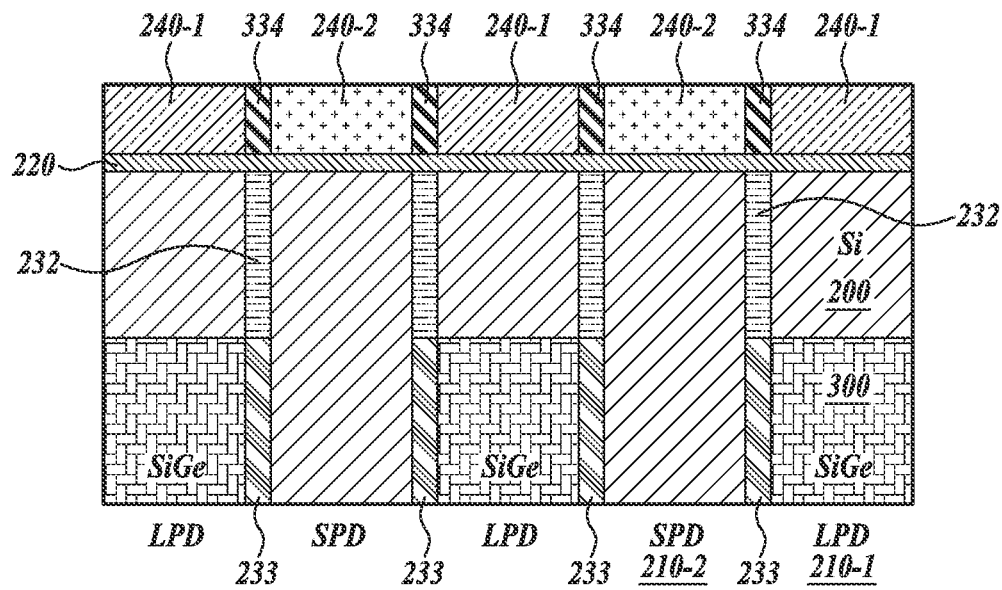
Figure 9F:
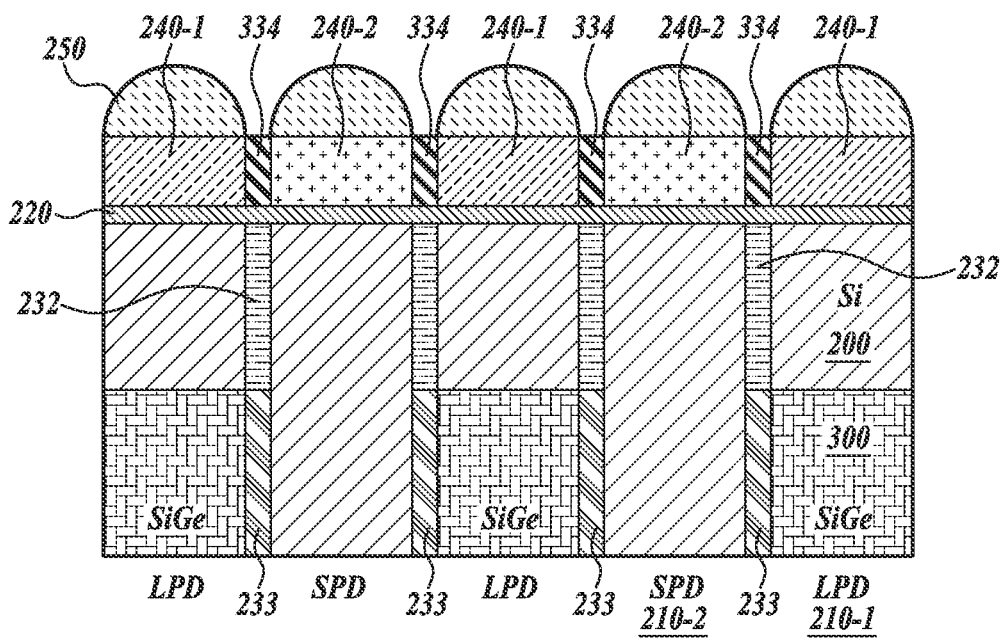
Figure 10A:
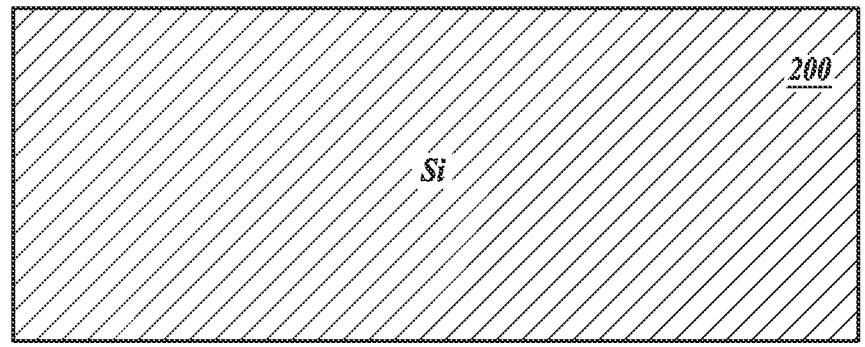
Figure 10B:
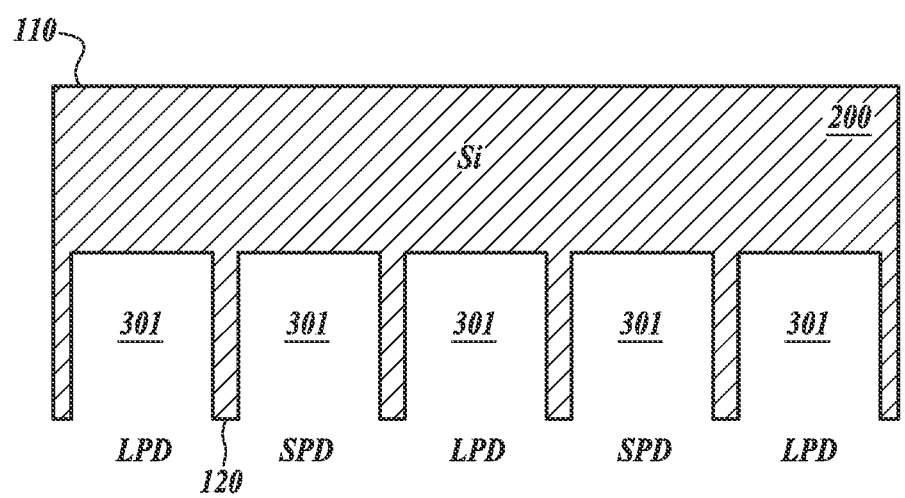
Figure 10C:
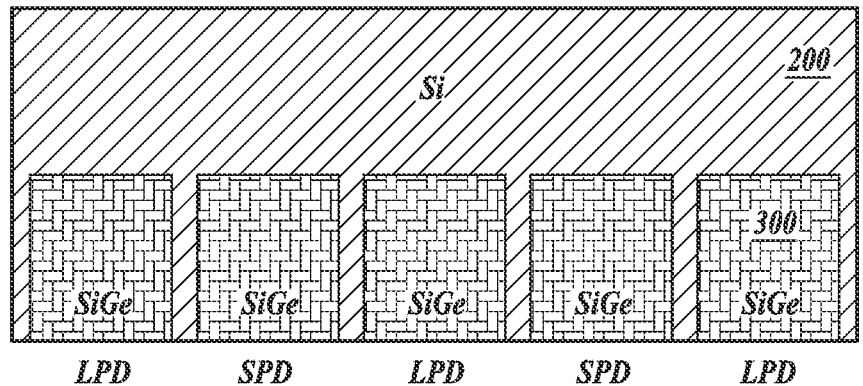
Figure 10D:
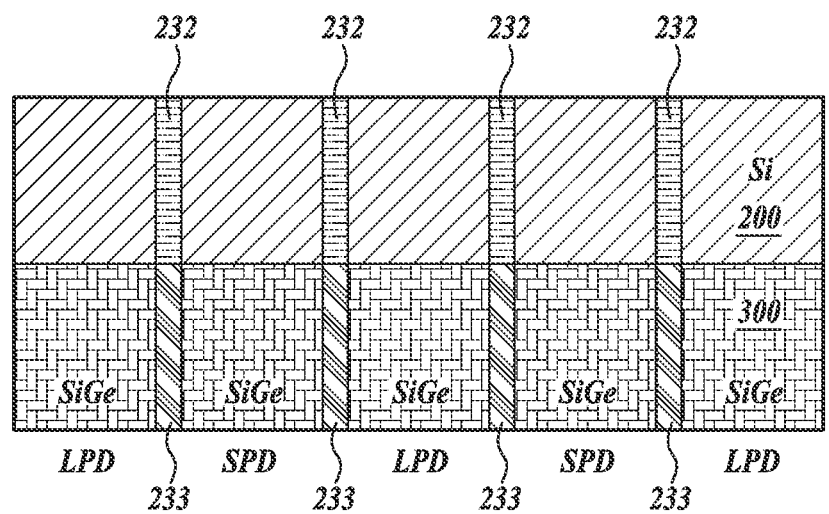

In the illustrated embodiment, an opening or a trench is defined in the Si material 200 in regions for LPDs 210-1. In an example, the opening or a trench (e.g., trench 301 shown in FIGS. 9B and 10B) is formed by removing a portion of Si material 200 from the front side 120 of Si material 200. The opening (or the trench) extends a fourth depth into Si material 200 from front side 120 of Si material 200, and the SiGe material 300 is disposed in the opening or the trench, for example by epitaxial growth process. In some embodiments, the opening (or trench) is spaced from the backside 110 (or illuminated side) of Si material 200 by a semiconductor material region (or substrate material region) of Si material 200. In some embodiments, a width of the opening (or the trench) is substantially the same as the light exposure area of the LPD 210-1. In embodiments, the plurality of openings (or the trenches) is optically aligned with the respective apertures defined by the metal grid 334 to the LPDs-210-1. The DTI structures 232 extend from the backside 110 of Si material 200 into the Si material 200 and interconnected forming a grid structure surrounding the LPD 210-1. In some embodiments, each of the plurality of DTI structures 232 is arranged to extend from the backside 110 of Si material 200 and landed on the opening (or the trench) containing the SiGe material 300. In one example, the fourth depth of the opening (or trench) is at least 1 um with respective to the front side 120 of Si material 200. In some embodiments, SiGe material may be included in both the photodiodes LPDs 210-1 and SPDs 210-2. For example, a plurality of openings (or trenches) are formed in Si material 200 corresponding to LPDs 210-1 and SPDs 210-2, and SiGe material 300 subsequently epitaxially grown inside the plurality of openings (or trenches). In one example, SiGe material 300 is in-situ doped with impurity (e.g., n-type dopants) in the plurality of openings to form photodiodes LPDs 210-1 and SPDs 210-2 during an epitaxial growth process. In some embodiments, to further increase light absorption, the DTI structures 232 may overlap with the opening (or trench) for SiGe material 300 in the vertical direction, such that each of the DTI structures 232 extends into the Si material 200 passing the boundary between the Si material 200 and the SiGe material 300 and overlapped with a portion of SiGe material 300. In some embodiments, each of the plurality of DTI structure 232 vertically overlaps with the SiGe material 300 by at least 10%.

Figure 8A:
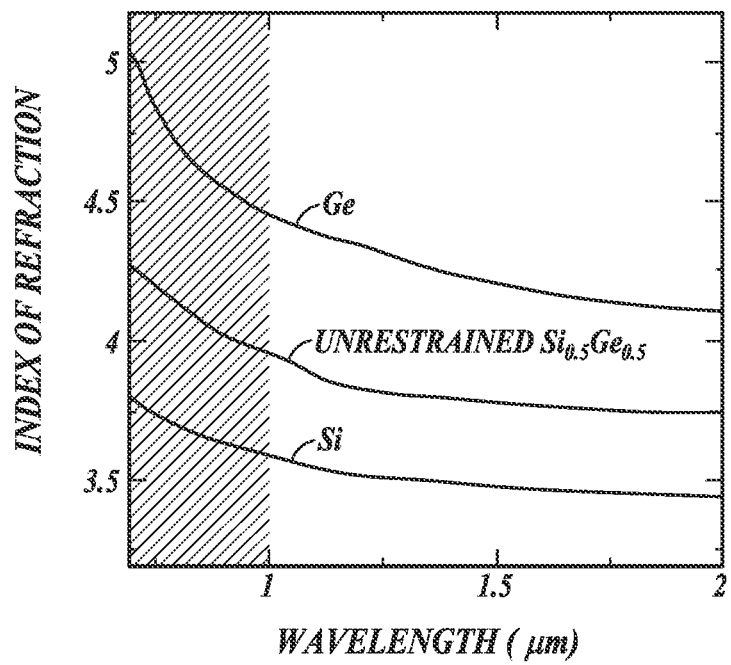
FIGS. 8A and 8B are graphs of index of refraction and absorption coefficient for different materials of photodiode.
Figure 8B:
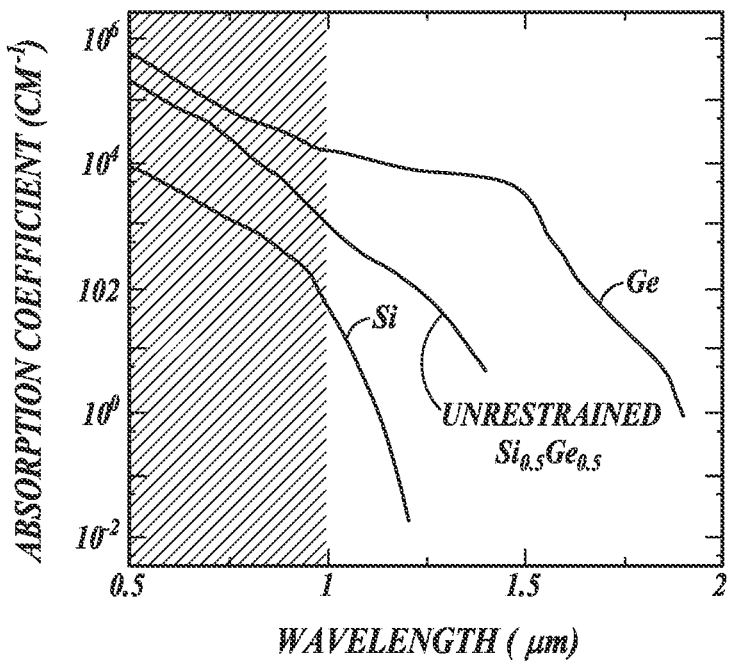

FIGS. 8A and 8B are graphs of index of refraction and absorption coefficient for different materials of the photodiode. The horizontal axis in both graphs indicate light wavelengths in micrometers. FIG. 8A shows index of refraction for Si, SiGe and Ge materials on the vertical axis. The index of refraction is consistently higher for Ge and SiGe in comparison to Si for a given wavelength. FIG. 8B shows absorption coefficient for Si, SiGe and Ge materials on the vertical axis. Again, the absorption coefficient is consistently higher for Ge and SiGe in comparison to Si for a given wavelength. Both of these material properties of SiGe operate to reduce crosstalk between the photodiodes, as explained, for example, with reference to FIG. 5A above.

FIGS. 9A-9F illustrate steps of a manufacturing process for a sample image sensor in accordance with an embodiment of the present technology. In some embodiments, the manufacturing process may include only some of the steps shown in the sequence of figures or may include additional steps that are not illustrated in the above sequence of figures.

In step one (FIG. 9A), the manufacturing process starts with a semiconductor material or a semiconductor substrate 200. In the illustrated example, the material of the semiconductor substrate is silicon (Si). However, one skilled in the art will appreciate that any group III elements (B, Al, Ga, In, Tl), group IV elements (C, Si, Ge, Sn, Pb), group V elements (N, P, As, Sb, Bi), and suitable combinations of these elements may be used to form the semiconductor substrate 200. In some embodiments, the semiconductor substrate 200 is a P-type doped Si substrate is additionally selectively doped regions in the semiconductor substrate 200 at a later step with N-type dopants or impurities to form a plurality of photodiodes. In some embodiments, the semiconductor substrate is a silicon or a bulk silicon substrate with a P-type doped epitaxial layer grown there on later step additionally selectively doped regions in the semiconductor substrate 200 with N-type dopants or impurities to form a plurality of photodiodes. In some embodiments, the P-type dopant may be Boron. Some examples of dopants of the N-type are Arsenic and Phosphorus.

In step two (FIG. 9B), a portion of the semiconductor substrate 200 is removed from a front side of the semiconductor substrate 200 to form a plurality of openings (or trenches). In different embodiments, forming the openings may include different manufacturing steps, for example, mask deposition, optically exposing the mask, etching. In an embodiment, each of the plurality of openings extend a trench depth into the semiconductor substrate 200 from a front side, wherein the trench depth is less than the thickness of the semiconductor substrate 200.

In embodiments, isolation wells are implanted in regions of the semiconductor substrate 200 between the adjacent LPD 210-1 and SPD 210-2, and between LPD 210-1 and SPD 210-2 and transistor regions. In some embodiments, a SiCoNi cleaning process is applied to the semiconductor substrate 200 to remove or cure damages (e.g., etching damages) made to the semiconductor substrate 200 during opening forming process. In step three (FIG. 9C), SiGe material 300 is formed in the plurality of openings. In some embodiments, SiGe material 300 is epitaxially grown within the plurality of openings. The areas of the SiGe material 300 correspond to photo-sensing areas of LPD 210-1. SiGe material 300 may be doped with suitable dopants, for example in-situ doped N-type dopants during epitaxial grow process to form photodiodes for LPDs 210-1. In some embodiments, SiGe material 300 may be deposited into the plurality of openings by suitable deposition technique, for example by chemical vapor deposition, atomic vapor deposition or the like. Regions correspond to SPDs 210-2 in semiconductor substrate 200 are doped with N-type dopant to form photodiode sensing regions for SPDs 210-2. In some embodiments, where the semiconductor substrate 200 is an N-type doped substrate, SiGe material 300 corresponds to LPDs 210-1 and Si regions correspond to SPD 210-2 in semiconductor substrate 200 that may be P-doped by implanting suitable dopants during the formation of photodiodes LPDs 210-1, SPDs 210-2. The epitaxial growth of the SiGe material 300 at the front side 120 of the semiconductor substrate 200 may be followed by floating diffusion implantation, source/drain region implantation, gate formation, and/or other steps of the front end process (not shown in FIG. 9C). In some embodiments, epitaxial growth of the SiGe material 300 at the front side 120 of the semiconductor substrate 200 may be performed prior to the formation of floating diffusion implantation, source/drain region implantation, and gate formation.

In step four (FIG. 9D), a plurality of DTI structures 232 may be formed by, for example, etching and material deposition from the backside 110 of the semiconductor substrate 200 into the semiconductor substrate 200. The plurality of DTI structures 232 are interconnected forming a grid structure surrounding photodiodes LPDs 210-1, SPDs 210-2. The material deposition may include oxide or metal material deposition. In some embodiments, the isolation well 233 may be formed from the front side 120 of the semiconductor substrate into the thickness (also referred to as depth) of the semiconductor substrate 200 by implantation of P-type dopants (e.g., boron). In the illustrated embodiment, the DTI structures 232 meet at the boundary of SiGe material 300 and Si material region of the semiconductor substrate 200. In other embodiments, the DTI structure 232 may extend a depth into passing the boundary or interface between the SiGe material 300 and Si material region of the semiconductor substrate 200 (similar to the illustration in FIG. 7 above). In embodiments, each of the plurality of DTI structures 232 extends into the semiconductor substrate passing the plurality of openings (or trenches) and overlaps with the SiGe material 300 in the plurality of openings (or trenches) by at least 10% in a vertical direction.

In step five (FIG. 9E), a dielectric layer 220 is deposited on a backside of semiconductor substrate 200 over the photodiodes LPDs 210-1, SPDs 210-2. In different embodiments, the dielectric layer 220 is formed of dielectric material and may include one or more layers. The dielectric material may include silicon oxide ($SiO_2$), hafnium oxide ($HfO_2$), silicon nitride ($Si_3N_4$), silicon oxynitride ($SiO_xN_y$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), or the like.

Color filters 240 (e.g., color filters 240-1, 240-2) may be formed over the dielectric layer 220 and arranged over respective photodiodes LPDs 210-1, SPDs 210-2. Metal grid 334 may separate the color filters from each other. Metallization 334 may be formed using, for example, copper or aluminum using different manufacturing steps, for example, mask deposition, optically exposing the mask, etching, material deposition, etc.

In embodiment, a light attenuation layer (for example, light attenuation layer 336) is further formed on metal grid 334 covering light exposure are of SPDs 210-2. The attenuation layer may be formed of titanium, titanium nitride, or a combination thereof.

In step six (FIG. 9F), microlenses 250 are formed over the color filters 240. In operation, the incoming light passes through the microlenses 250, color filters 240, and dielectric layer 220 toward the respective photodiodes SPDs 210-2 and LPDs 210-1.

FIGS. 10A-10F illustrate steps of a manufacturing process for a sample image sensor in accordance with an embodiment of the present technology. In some embodiments, the manufacturing process may include only some of the steps shown in the sequence of figures or may include additional steps that are not illustrated in the above sequence of figures. The manufacturing process illustrated in FIGS. 10A-10F is generally similar to that illustrated in FIGS. 9A-9F except that the SiGe material is epitaxially grown in the plurality of openings formed corresponding to areas of both the LPDs 210-1 and SPDs 210-2, with adjacent openings spaced by semiconductor substrate material. As explained above, such additional SiGe material that is associated with the SPDs may further reduce crosstalk among the photodiodes.

Figure 11:
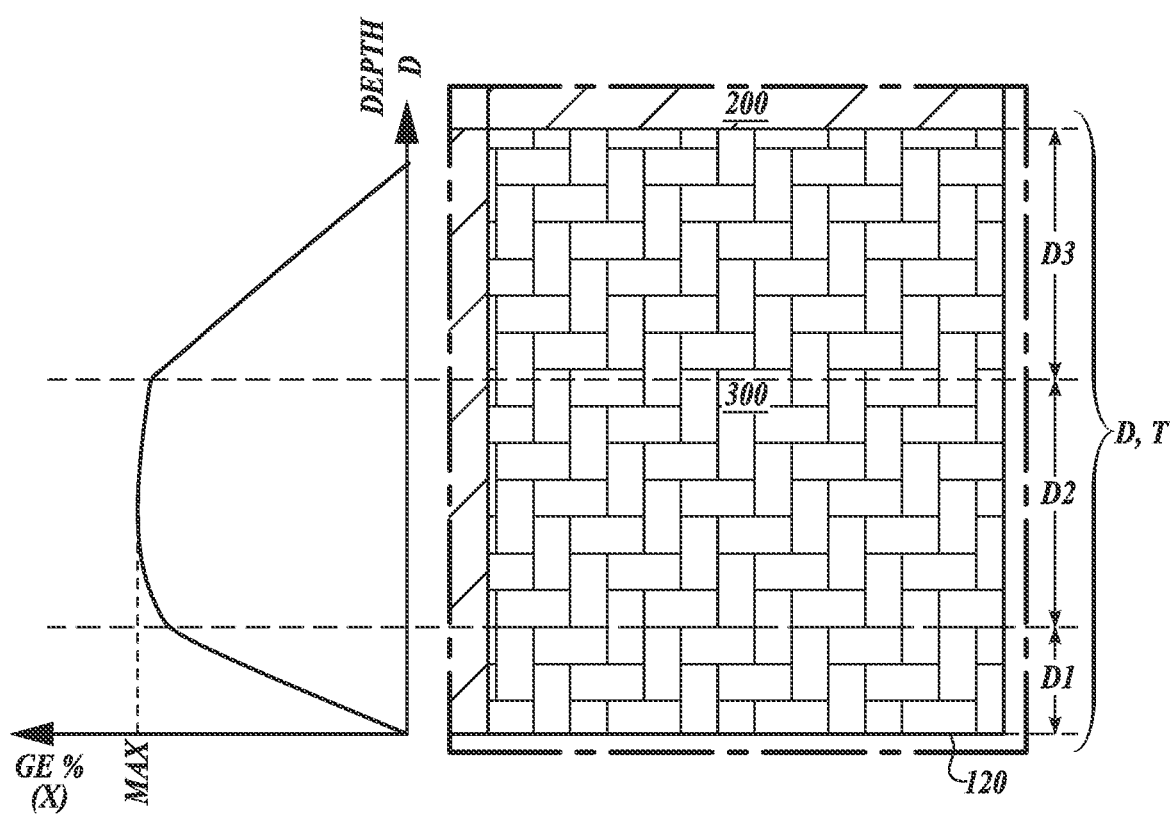
FIG. 11 is a graph of Ge concentration along semiconductor substrate in accordance with an embodiment of the present technology.

FIG. 11 is a graph of Ge concentration along the thickness or depth of semiconductor substrate (e.g., Si material or semiconductor substrate 200) in accordance with an embodiment of the present technology. FIG. 11 includes Detail B of FIG. 10F. The graph to the left of the Detail B is aligned with the SiGe material 300 such that the "depth, D" axis of the graph is parallel to the depth D (also referred to as the thickness "T" of SiGe material 300) of the SiGe material with respect to a front side 120 of the semiconductor substrate (e.g., Si material 200). The graph indicates Ge concentration in the SiGe material 300, i.e., the value of x in $Si_{1-x}Ge_x$ stochiometric formula. In some embodiments, the value of x increases gradually from about zero at the front side 120 of the semiconductor substrate (e.g., Si material 200) to some maximum value of x corresponding a depth inside the SiGe material region. In some embodiments, such maximum value of x may be within a range from 0.3 to 0.7. That is, the maximum concentration of Ge in SiGe material can range from 30% to 70%. The value of x may be gradually reduced to zero at the interface between SiGe material 300 and Si material 200. For example, depth D1 may correspond to 10-20% of the overall depth D for gradual transition from a first silicon (Si) material region in the semiconductor substrate to $Si_{1-x}Ge_x$ for reducing the lattice mismatch. Depth D2 may correspond to 60-80% of the overall depth D for maximum absorption of light. Depth D3 may correspond to 0-20% of the overall depth D for gradual transition from $Si_{1-x}Ge_x$ to a second Si material region in the semiconductor substrate for reducing the lattice mismatch. Other values are possible in different embodiments. In some embodiments, such gradual change of x reduces dark currents generated by the mismatch and stress in crystal lattice, while preserving higher light-absorption and refraction coefficient associated with SiGe material 300.

Many embodiments of the technology described above may take the form of computer- or controller-executable instructions, including routines executed by a programmable computer or controller. Those skilled in the relevant art will appreciate that the technology can be practiced on computer/controller systems other than those shown and described above. The technology can be embodied in a special-purpose computer, application specific integrated circuit (ASIC), controller or data processor that is specifically programmed, configured or constructed to perform one or more of the computer-executable instructions described above. Of course, any logic or algorithm described herein can be implemented in software or hardware, or a combination of software and hardware.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a plurality of pixels arranged in rows and columns of a pixel array disposed in a semiconductor material, wherein each pixel comprises a plurality of photodiodes, wherein the plurality of pixels are configured to receive an incoming light through an illuminated surface of the semiconductor material,
   wherein each pixel comprises:
   a first photodiode comprising a silicon (Si) material; and
   a second photodiode comprising the Si material and a silicon germanium (SiGe) material,
   wherein each of the plurality of first photodiodes has a light sensitivity that is lower than each of the plurality of second photodiodes, and each individual second photodiode is arranged in between adjacent first photodiodes,
   wherein a concentration of Ge of the SiGe material varies through a depth of the SiGe material in a vertical direction from the illuminated surface of the semiconductor material to an non-illuminated surface of the semiconductor material opposite to the illuminated surface of the semiconductor material, and
   wherein the concentration of Ge of the SiGe material:
   increases from zero concentration at the non-illuminated surface of the semiconductor material to a maximum concentration at a first depth located within the SiGe material, and
   decreases from the maximum concentration to zero at a second depth located between the first depth and the illuminated surface of the semiconductor material.

2. The image sensor of claim 1, wherein the Si material of the first photodiode is laterally disposed in between the SiGe material of adjacent second photodiodes.

3. The image sensor of claim 1, wherein the concentration of Ge within the SiGe material varies as $Si_{1-x}Ge_x$, wherein x changes gradually through the depth of the SiGe material.

4. The image sensor of claim 3, wherein a maximum value of x within the depth of the SiGe material is within 0.3-0.7.

5. The image sensor of claim 1, wherein the Si material of individual first photodiodes and the Si material of individual second photodiodes are separated by a plurality of deep trench isolation (DTI) structures.

6. The image sensor of claim 5, wherein the SiGe material is disposed in a trench that extends to a depth into the semiconductor material from a non-illuminated side that is opposite to the illuminated side of the semiconductor material, and wherein each of the plurality of DTI structures vertically extends into the semiconductor material passing the trench and overlaps with the SiGe material by at least 10% in a vertical direction.

7. The image sensor of claim 5, wherein the DTI structures at least partially separate the SiGe material of individual second photodiodes from adjacent first photodiodes.

8. The image sensor of claim 1, wherein the second depth is located at an interface between the SiGe material and a second silicon material of the semiconductor material, and wherein the second silicon material is configured between the SiGe material and the illuminated surface of the semiconductor material.

9. The image sensor of claim 1, wherein the concentration of Ge of the SiGe material:
   gradually increases from zero to a first concentration at a third depth located between the non-illuminated surface of the semiconductor material and a first depth, wherein the first concentration ranges from 10% to 20%;
   gradually increases from the first concentration at the third depth to a maximum concentration at the first depth within the SiGe material, wherein the maximum concentration is greater than the first concentration; and
   gradually decreases from the maximum concentration at the first depth to zero at a second depth that is located an interface between the SiGe material and a second silicon material of the semiconductor material that is disposed between the SiGe material and the illuminated surface of the semiconductor material.

10. The image sensor of claim 9, wherein the first concentration ranges from 10% to 20%.

11. An image sensor, comprising:
    a plurality of pixels arranged in rows and columns of a pixel array disposed in a semiconductor material, wherein each pixel comprises a plurality of photodiodes, wherein the plurality of pixels are configured to receive an incoming light through an illuminated surface of the semiconductor material,
    wherein each pixel comprises:
    a first photodiode comprising a silicon (Si) material; and
    a second photodiode comprising the Si material and a silicon germanium (SiGe) material,
    wherein the SiGe material of the second photodiode is disposed in a trench formed in the semiconductor material, and wherein the first photodiode further comprises an additional SiGe material, and the additional SiGe material of each individual first photodiode is disposed in an additional trench adjacent to the trench formed in the semiconductor material.

12. The image sensor of claim 11, wherein each of the plurality of first photodiodes has a full well capacity smaller than each of the plurality of second photodiodes, and each individual second photodiode is arranged in between adjacent first photodiodes.

13. The image sensor of claim 11, wherein the Si material of individual second photodiodes and the Si material of individual first photodiodes are separated by deep trench isolation (DTI) structures, and wherein the SiGe material of individual second photodiodes and the SiGe material of individual first photodiodes are separated by isolation wells.

14. The image sensor of claim 11, wherein the Si material of individual second photodiodes and the Si material of individual first photodiodes are separated by deep trench isolation (DTI) structures, and wherein the SiGe material of individual second photodiodes and the SiGe material of individual second photodiodes are separated by the DTI structures at least partially along a depth of the SiGe material.

15. The image sensor of claim 11, wherein a concentration of Ge of the SiGe material increases from zero concentration at a second surface of the semiconductor material to a maximum concentration at a first depth located within the SiGe material and decreases from the maximum concentration to zero at a second depth located between the first depth and the illuminated surface of the semiconductor material, wherein the second surface of the semiconductor material is opposite to the illuminated surface of the semiconductor material.

* * * * *